(12) United States Patent
Whiteley

(10) Patent No.: US 11,346,872 B1
(45) Date of Patent: May 31, 2022

(54) DIRECT MEASUREMENT OF JOSEPHSON JUNCTION CAPACITANCE

(71) Applicant: Synopsys, Inc., Mountain View, CA (US)

(72) Inventor: Stephen Robert Whiteley, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 141 days.

(21) Appl. No.: 16/710,926

(22) Filed: Dec. 11, 2019

Related U.S. Application Data

(60) Provisional application No. 62/781,654, filed on Dec. 19, 2018.

(51) Int. Cl.
*G01R 27/26* (2006.01)
*G01D 5/24* (2006.01)
*G01D 5/243* (2006.01)

(52) U.S. Cl.
CPC .......... *G01R 27/2605* (2013.01); *G01D 5/24* (2013.01); *G01R 27/26* (2013.01); *G01D 5/243* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; G01D 5/243
USPC ....... 324/500, 512, 519, 537, 548, 600, 649, 324/652, 658, 667, 668, 674, 675, 681, 324/682, 686; 345/173, 174; 702/47
See application file for complete search history.

(56) References Cited

U.S. PATENT DOCUMENTS

| | | | |
|---|---|---|---|
| 4,144,465 A | 3/1979 | Faris | |
| 4,631,423 A * | 12/1986 | Faris | ............ G01R 13/342 327/186 |
| 4,837,604 A | 6/1989 | Faris | |
| 5,045,788 A | 9/1991 | Hayashi et al. | |
| 5,102,862 A * | 4/1992 | Okabe | ............ H01L 39/225 257/35 |
| 5,646,526 A | 7/1997 | Takeda et al. | |
| 5,942,909 A * | 8/1999 | Zhu | ............ H01L 22/14 324/762.05 |

(Continued)

FOREIGN PATENT DOCUMENTS

EP     0310249 A1    4/1989

OTHER PUBLICATIONS

Xiong et. al., Measurement of Specific Capacitance for Nb/Al—AlOx/Nb Josephson Junctions in Single-Flux Quantum Circuit Applications, IEEE Transactions on Applied Superconductivity, vol. 28, No. 4, dated Jun. 2018, 5 pages.

(Continued)

*Primary Examiner* — Hoai-An D. Nguyen
(74) *Attorney, Agent, or Firm* — Haynes Beffel & Wolfeld LLP; Andrew Dunlap

(57) ABSTRACT

The independent claims of this patent signify a concise description of embodiments. Disclosed is technology for direct measurement of the capacitance of a Josephson junction. Roughly, the technique includes detecting the resonance frequency f of the junction under test, determining the DC voltage Vp across the junction under test at resonance frequency, and determining the capacitance of the junction under test in dependence upon the critical current Ic of the junction under test and the DC voltage Vp. This Abstract is not intended to limit the scope of the claims.

12 Claims, 9 Drawing Sheets

(56) References Cited

U.S. PATENT DOCUMENTS

| | | | | |
|---|---|---|---|---|
| 2011/0121656 A1* | 5/2011 | Hicks | ............... | H02J 1/108 307/80 |
| 2016/0305994 A1* | 10/2016 | Kermorvant | ......... | G01R 23/165 |
| 2018/0366611 A1* | 12/2018 | Ban | ............. | H01L 41/0478 |

OTHER PUBLICATIONS

Kleinsasser et. al., Direct Measurement of the Josephson Plasma Resonance Frequency From I-V Characteristics, IEEE Transactions on Applied Superconductivity, vol. 15, No. 2, dated Jun. 2005, 4 pages.

Steinbach et. al., Direct Measurement of the Josephson Supercurrent in an Ultrasmall Josephson Junction, The American Physical Society, vol. 87, No. 13, dated Sep. 24, 2001, 4 pages.

Maezawa et. al., Specific capacitance of Nb/AlOx/Nb Josephson junctions with critical current densities in the range of 0.1-18 kA/cm2, American Institute of Physics, vol. 66, dated 1995, 4 pages.

Arnett, High Speed Power System for Josephson Logic, IEEE Transactions on Magnetics, vol. 16, No. 5, dated Sep. 1980, 3 pages.

Sillanpaa et. al., Direct observation of Josephson capacitance, Physical Review Letters, vol. 95, dated 2005, 5 pages.

Magerlein, Specific Capacitance of Josephson Tunnel Junctions, IEEE Transactions on Magnetics, vol. 17, No. 1, dated Jan. 1981, 4 pages.

Basavaiah et. al., Measurements of device parameters on large arrays of Josephson interferometers, Journal of Applied Physics, vol. 51, No. 3, dated Mar. 1980, 9 pages.

Nagel, Asymmetric SQUIDs and nanoSQUIDs: Quantum Interferometer under novel conditions, Dissertation—Eberhard Karls University, Tubingen, Germany, dated 2012, 87 pages.

Tuckerman, A Josephson ultrahighresolution sampling system, Applied Physics Letters, vol. 36, dated Jan. 23, 1980, 4 pages.

Faris, Generation and measurement of ultrashort current pulses with Josephson devices, Applied Physics Letters, vol. 36, dated Jan. 14, 1980, 4 pages.

Gross et. al., Applied Superconductivity: Josephson Effect and Superconducting Electronics—Chapter 5—Digital Electronics, Walther Meissner Institute, Garching, dated Oct. 2005, 73 pages.

* cited by examiner

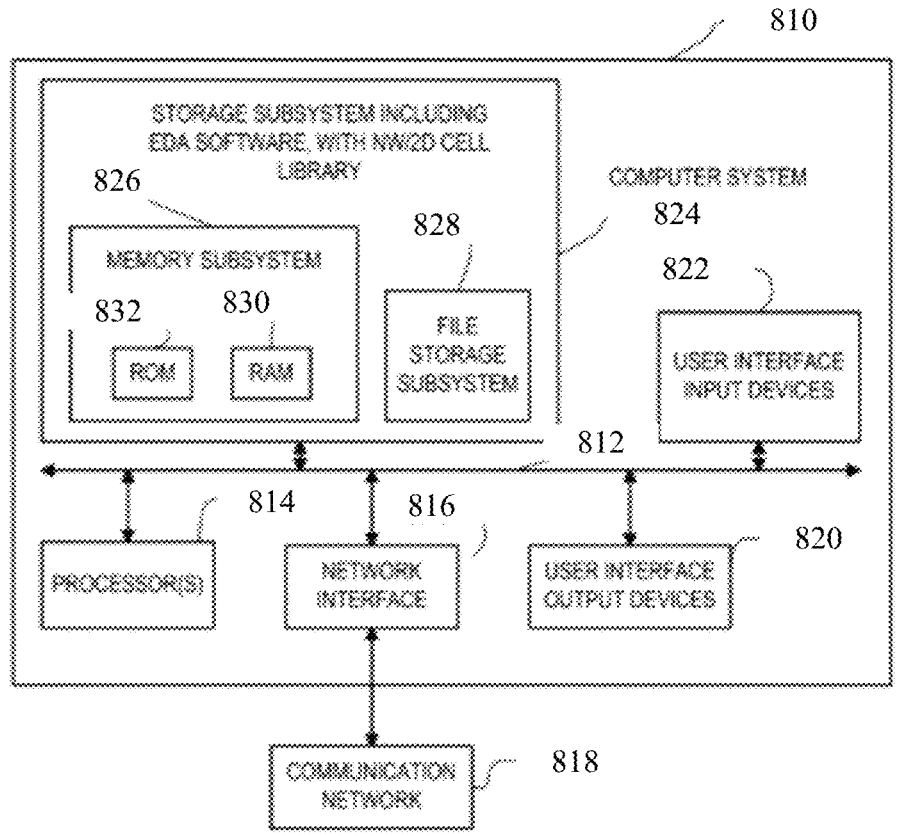
FIG. 8A
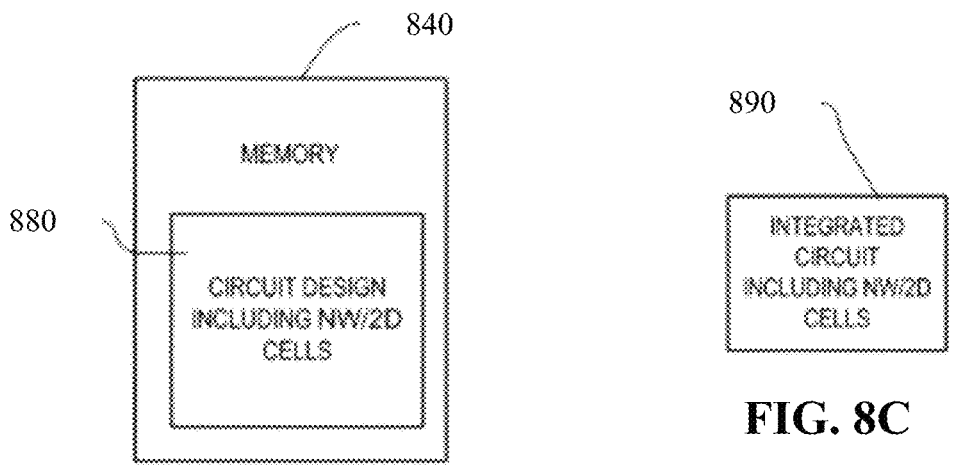
FIG. 8B
FIG. 8C

US 11,346,872 B1

DIRECT MEASUREMENT OF JOSEPHSON JUNCTION CAPACITANCE

CROSS-REFERENCE TO RELATED APPLICATIONS

This application claims priority under 35 U.S.C. § 119(e) to U.S. Provisional Application No. 62/781,654, filed on Dec. 19, 2018, the entire contents of which are hereby incorporated by reference herein.

FIELD OF THE INVENTION

This invention relates to the modeling of integrated circuit devices in computer-aided design (CAD) and electronic design automation (EDA) systems, and more specifically to modeling and simulating conductors in an integrated circuit (IC).

This invention relates to Josephson junctions, and more particularly to techniques for measuring the capacitance of a Josephson junction for purposes of improving the designs of devices that include them.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments.

BACKGROUND

Josephson junctions are an important circuit element in many superconducting electronic systems, such as superconducting quantum interferences devices (SQUIDs), rapid single flux quantum devices (RSFQs), and for use in superconducting qubits which are the heart of many quantum computing systems that are increasingly important to the nation's economic and national security. A background introduction to the Josephson junction is available at a Wikipedia page: https://en.wikipedia.org/wiki/Josephson effect.

A Josephson junction typically has an S-I-S, S-N-S, or S-s-S structure, two layers of superconducting material (the 'S') with a thin region between them consisting of either an insulator (the 'I'), non-superconducting material (the 'N') or a physical constriction (the 's'). These junctions exhibit the Josephson effect, by which a direct current flows indefinitely through the junction without any voltage applied, a phenomenon that can be used to build multiple types of quantum electronic circuits. Of these, the S-I-S structure is most commonly used and technologically important. Such junctions are also called "tunnel junctions" as the current flow through the insulator is due to quantum mechanical tunneling.

One important characteristic of a Josephson tunnel junction, information useful during circuit design, manufacturing, testing and field operation, is the capacitance of the junction (Josephson junction capacitance, herein sometimes abbreviated 'JcC'). Such junctions consist of two superconducting electrodes on either side of a thin dielectric (insulator), which forms a capacitor. Such junctions typically have large relative capacitances due to the thinness of the dielectric region between the two superconducting elements. The junction's capacitance has an important effect on the terminal characteristics of the junction, and is responsible for the hysteresis seen in the I-V curves of such junctions, another feature useful for building devices. The capacitance also plays an important role in the dynamics of the junction operating at high frequencies. For example, the capacitance of the junction must be known to accurately choose the amount of shunt resistance to achieve "critical damping", where the best-case trade-off between operating speed and data integrity in digital circuits can be achieved.

While there exist methods to measure JcC, existing methods are neither easy to use, nor provide accurate results, or don't allow direct measure of the capacitance (instead, measuring other characteristics and fitting the data to a model to determine the JcC). Some of the existing methods include: connection of a large junction to a reference inductance, measure the resonance frequency to then calculate the JcC; time-domain approaches to try to measure the RC value of the junction (and divide by R); microwave measurements to attempt to de-embed the JcC from a test structure impedance; and measuring the Shapiro steps and fit the measured data to models to then calculate the JcC.

U.S. Pat. No. 4,631,423, "Ultra high resolution Josephson sampling technique" (issued in 1986) describes a system that enables measurement and display of ultra-high frequency signals. This does not directly apply to capacitance measurement. Two later papers try to measure capacitance directly: by inference of the JcC from measurements of I-V curves: "Direct measurement of the Josephson plasma resonance frequency from I-V characteristics" (IEEE. Transactions on Applied Superconductivity, June 2005, 86-98), and "Specific capacitance of Nb/AlOx/Nb Josephson junctions with critical current densities in the range of 0.1-18 kA/cm2" (Applied Physics Letters, 17 Apr. 1995, 2134-2136). One way to measure the currents flowing through the junctions is seen in a paper, "Direct measurement of the Josephson supercurrent in an ultrasmall Josephson junction" (Physical Review Letters, 24 Sep. 2001, 137003-1 to 137003-4), but in not measuring the junction's plasma resonance frequency, the capacitance cannot be JcC. All documents mentioned in this paragraph are incorporated herein for their teachings.

What all others have failed to teach are methods and devices to allow the direct measurement of JcC that is fast, accurate, does not require inference, mostly uses conventional circuitry on the superconducting device using the junctions, and can be used on a chip lot-to-lot basis during manufacturing.

SUMMARY

The claims signify a brief description of one or more of the innovations, embodiments, and/or examples found within this disclosure.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

Direct measurement of the capacitance of a Josephson junction is achieved. Roughly described, a VCO has a control input and an output connected to apply an oscillating voltage across the junction, a signal generator applying a varying voltage to the control input, and a resonance detector which detects when the current passing through the junction is at a minimum. The voltage at the VCO control input when resonance is detected is usable to determine the capacitance of the junction under test. A method includes detecting the resonance frequency f of the junction under test, determining the DC voltage Vp across the junction under test at resonance frequency, and determining the capacitance of the junction under test in dependence upon the critical current Ic of the junction under test and the DC voltage Vp.

One or more embodiments of the invention or elements thereof can be implemented in the form of a computer product including a non-transitory computer readable storage medium with computer usable program code for performing the method steps indicated. Furthermore, one or more embodiments of the invention or elements thereof can be implemented in the form of an apparatus including a memory and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

These and other features, aspects, and advantages of the invention will become apparent from the following detailed description of illustrative embodiments thereof, which is to be read in connection with the accompanying drawings.

BRIEF DESCRIPTION OF THE DRAWINGS

The invention will be described with respect to specific embodiments thereof, and reference will be made to the drawings.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIGS. 8A, 8B and 8C depict simplified block diagrams of a computer system suitable for use with embodiments of the technology, as well as circuit design and circuit embodiments of the technology.

Figure 1:
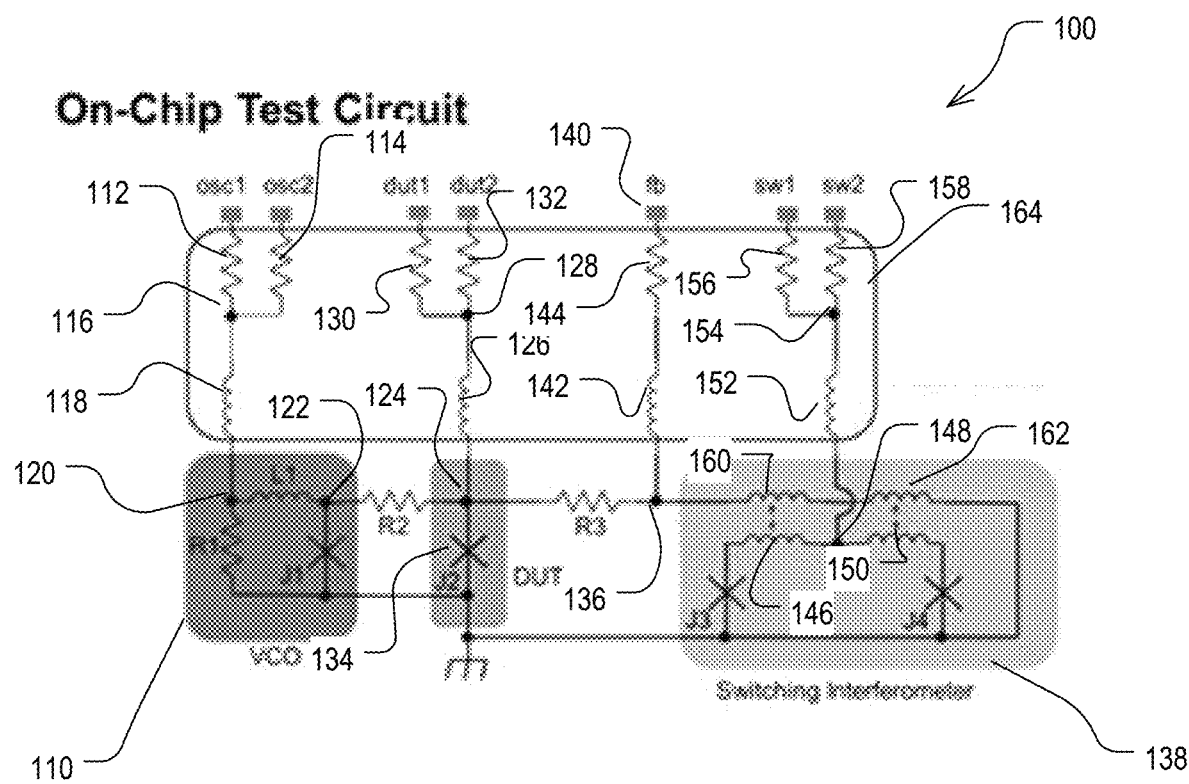
FIG. 1 is a schematic diagram of a capacitance measurement test circuit site incorporating features of the invention.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The following Detailed Description, Figures and Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

In embodiments of the claimed invention, new methods and circuits are enabled for improved measurements of the capacitance of Josephson junctions. Many of the embodiments comprise a test circuit, which includes a Josephson junction device under test ('DUT'), a voltage controlled oscillator ('VCO'), and a sensitive threshold detector capable of responding to extremely high frequencies. This improved test circuit can directly measure the junction's internal resonance frequency, from which the JcC is directly calculated. This is accomplished by sweeping the VCO through the resonance of the DUT, and measuring the amplitude of the resulting oscillating voltage across the DUT with the threshold detector. As the VCO is itself a Josephson junction, the frequency is exactly known from the applied voltage, which is easily measured. The voltage applied to the VCO where the oscillation amplitude across the DUT is maximum yields the resonance frequency, and thus capacitance of the DUT.

These embodiments are enabled using standard superconducting electronic circuitry, and can be part of a PCM ('Process Control Module') test area that a chip foundry uses to measure and track the properties of fabricated devices and circuits. While the on-chip circuitry is operated at cryogenic temperature, this circuitry is connected to specialized room-temperature circuitry that provides the measurement drive signals and processes the chip outputs to then determine the JcC. The room-temperature circuitry involves a small number of standard electrical components such as operational amplifiers, and can be controlled by a processor in a manufacturing environment.

A benefit of embodiments of the claimed invention is that once configured, the JcC measurement is fast and accurate, and allows capacitance to be frequently measured and tracked, as opposed to earlier approaches that are time consuming and therefore less frequent, and require data analysis by a highly-trained professional to determine the JcC.

Data for the PCM measurements can be obtained after a set of wafers are manufactured and separated into individual chips, and provide diagnostic and characterization data for the chips from that lot. In the past, junction capacitance was not generally included in these measurements, due to measurement complexity, and the value was assumed to be constant (which can be an expensive false assumption), lot-to-lot, based on a separate measurement obtained earlier, perhaps in process development.

The embodiments of the claimed inventions improve the logistics and economics of manufacturing superconducting devices by directly and conveniently measuring the JcC on a per-lot basis. This improvement provides chip design engineers with more accurate JcC values, and perhaps more importantly, with the range of variation of JcC values, which can be integrated into the variation analysis used to predict chip performance and yield during the design process. Higher yield leads to improved profits. The more accurate JcC values also facilitate performance maximization, as the values of other circuit parameters can be specified with greater confidence to achieve performance objectives. This improves the quality of manufactured chips, thereby increasing their value.

In some of the embodiments of the claimed inventions, the Josephson junction internal resonance frequency (geometric capacitance and Josephson inductance) is measured directly, using an on-chip frequency domain analysis system using a Josephson VCO signal source, and an interferometer threshold detector feedback system to measure the amplitude of the signal applied to the device under test. One can map out the frequency response, which is strongly peaked at the resonance frequency, and determine this frequency by measuring the voltage across the oscillator junction.

FIG. 1 is a schematic diagram of a capacitance measurement test circuit site incorporating features of the invention. In one embodiment, the circuit is typically only one of several on the wafer, each with a different DUT junction area or shape or size (collectively a "junction type") from a library of junction types available to chip designers. The junction capacitances measured for the different junction types are then used to obtain correction factors for the capacitance to critical current variation caused by fringing. If both critical current and capacitance are proportional to device area, then the ratio will be constant for a given process. This is not true in general, as the capacitance is not strictly proportional to device area, as "fringing fields" which are found at the edge of the structure contribute some of the capacitance, which is proportional to the perimeter rather than the area.

The test site requires only four junctions including the device under test, and requires very little surface area on a superconducting circuit substrate. The circuit includes a Josephson junction voltage controlled oscillator (VCO) 110, with two terminals osc1 and osc2. The two terminals allow a "4-terminal" measurement of the junction voltage to be made. The terminals osc1 and osc2 are each connected through a respective series resistance 112 and 114, to a common node 116 which is connected through an inductor 118 to the voltage control node 120 of the VCO 110. The first terminal osc1 is driven by a current source (not shown) that ramps in time, sweeping the junction voltage on the VCO 110 and therefore the oscillation frequency through a range. (In general it is only necessary that the oscillation frequency vary until resonance is detected; a monotonically increasing frequency is preferred, though a monotonically decreasing signal can be used instead, as can other varying frequencies. Alternatively the signal source can apply a sawtooth or other repetitive waveform, allowing multiple measurements which can then be averaged or otherwise combined). The terminal osc2 is used to measure the actual voltage being applied to the VCO 110 at any given time. This voltage is proportional to the oscillation frequency, and embodiments of the invention measure this voltage accurately.

The VCO 110 includes a resistor R1 from node 120 to ground, and an inductance L1 from node 120 to a second node 122, which is in turn connected through a Josephson junction J1 to ground. Node 122 is the output of the VCO 110, and it has a voltage which oscillates at a frequency proportional to the signal applied to the control input node 120. The VCO 110 takes advantage of the AC Josephson effect, in which a single Josephson junction acts as a voltage-controlled oscillator (VCO). Very small shunt resistance R1 converts DC or slowly varying applied input current to a DC or slowly varying voltage bias across the junction. Inductance L1 acts to prevent the generated oscillations from being shunted. As used herein, the term "signal" can be either a voltage signal or a current signal.

The VCO output node 122 is connected through a resistor R2 to a node 124, which is connected through the Josephson junction J2, which is the DUT 134, to ground. Resistor R2 couples some of the VCO output into J2, which remains in the superconducting state though the structure behaves like a resonant cavity. Node 124 is further connected through an inductance 126 to a node 128, and from there via two resistors 130 and 132 to respective terminals dut1 and dut2. The terminals dut1 and dut2 are used for measuring the critical current Ic of the DUT as described below, and are not used or connected during measurement of the junction capacitance.

The Output from the DUT 134, at node 124, is further connected via a series resistance R3 to a control input node 136 of a two-junction Josephson interferometer 138. A feedback (fb) terminal 140 is also connected to control input node 136, via series connected inductance 142 and resistance 144. The fb terminal 140 allows an external current to be applied to the interferometer control node 136. It will be seen that the interferometer 138 is operated as a detector of the RF signal from the DUT 134, and the current through the fb terminal 140 will track the amplitude of the RF signal through use of a feedback loop.

The interferometer 138 includes one branch connecting a biasing and monitoring node 148 to ground through one Josephson junction J3 series-connected with one inductance 146, and a second branch connecting node 148 to ground through another Josephson junction J4 series-connected with another inductance 150. Node 150 is further connected through an inductance 152 to a node 154, and from there via two resistors 156 and 158 to respective terminals sw1 and sw2. The terminal sw1 is used for biasing of the interferometer and sw2 is used for monitoring it. The input signal from control node 136 is applied to the interferometer 138 by way of two series-connected inductances 160 and 162 to ground. These inductances couple the input signal magnetically to the two inductances 146 and 150, respectively, of the interferometer 138.

None of the Josephson junctions in the test circuit 100 are shunted. In addition, it will be appreciated that instead of resistors R2 and R3 to couple to/from the DUT, small value capacitors could be used. Additionally, note that the inductors and resistors within the outline 164 provide RF filtering and isolation, allowing the 4-terminal measurements mentioned herein.

Figure 2:
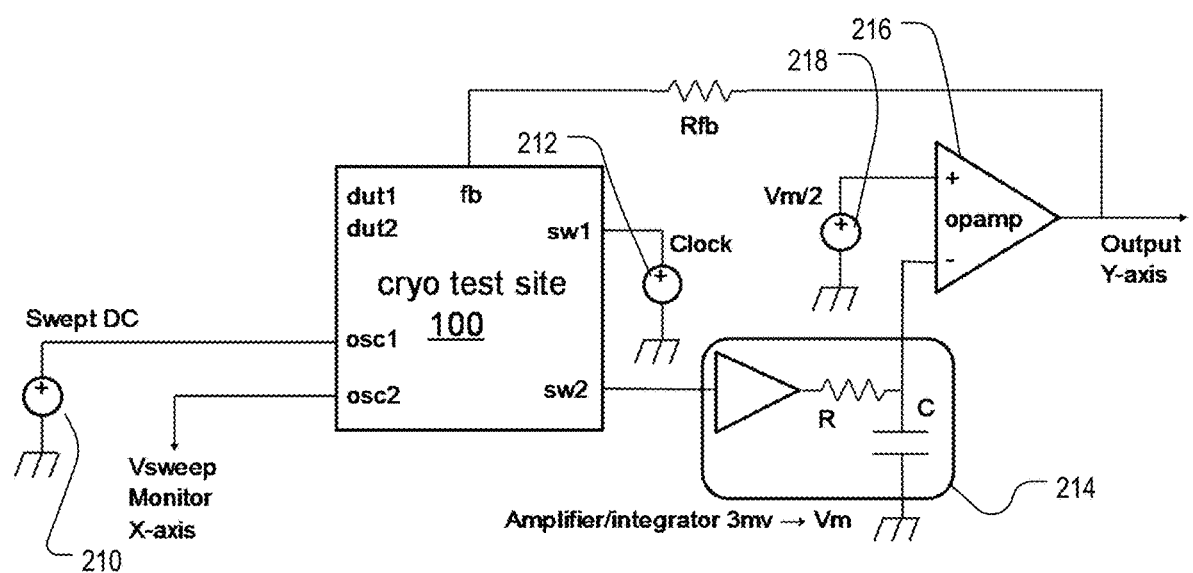
FIG. 2 illustrates circuitry of an external measurement system for the cryogenic test site of FIG. 1

FIG. 2 illustrates circuitry of an external measurement system for the cryogenic test site 100. While the test site 100 is formed on the chip and operated at cryogenic temperatures (sufficiently low to enable superconductivity of the materials used), the additional circuitry of FIG. 2 is operated at higher temperatures (e.g. room temperature). Connections can be made through a standard low-speed sample-holder immersed in a dewar containing liquid helium. The terminals dut1, dut2, osc1, osc2, fb, sw1 and sw2 in FIG. 1 are indicated in the drawing of FIG. 2.

As shown in FIG. 2, the osc1 terminal is connected to a sweeping voltage source 210, such as a standard function generator. The frequency of the voltage sweep will be low-audio or sub-audio, such as between 0.1-100 Hz, though in other embodiments it could be as high as 1 MHz. This sweep frequency, and the frequency at which the resulting VCO output frequency sweeps, is sometimes referred to herein as being a "slow" sweep. The circuit is designed such that the amplitude of the current driven through the junction 134 remains too low to switch the junction to the voltage state. The osc2 terminal outputs a signal for monitoring the voltage across the oscillating junction J1. Not shown is additional amplification and low-pass filtering that may be required for this line. This signal can be thought of as sweeping the X input to an X-Y plotter or oscilloscope, or data acquisition system.

The sweep frequency can be thought of as the repetition rate of the measurement. The higher the frequency chosen for this rate, the better the resolution, the lower the noise, and the faster the results. On the other hand, higher repetition rates may require better (and more expensive) circuit components, an the circuit may become more sensitive to stray capacitance and other parasitics. One additional limiting factor on the sweep frequency is the nature of the device recording the output. If the recording device is mechanical, such as an x-y plotter, then the drawing rate sets the maximum repetition rate to a relatively low value. If it a computer A/D converter, higher rates would be possible, perhaps on the order of kilohertz. If the recording device is an oscilloscope, then the repetition rate could be much higher, such as 1 MHz.

Another clock source 212, in one embodiment a square wave signal (though other embodiments the signal duty cycle can differ from 50%), is applied to the sw1 terminal of the switching interferometer 138. The frequency of the clock source 212 may be on the order of a megahertz. The amplitude is chosen so that there is a 50% probability that the interferometer will switch to the voltage state on a given clock cycle of the clock source 212, while the feedback system is active. This amplitude is below the level required to switch the device when no feedback current is present.

The frequency of clock source 212 should be much higher than the sweep frequency of the VCO input signal, for example by a factor of 1000 or more. Generally, the higher the frequency of clock source 212 the better, because higher frequencies provide more samples per unit time, which when averaged give a cleaner signal. On the other hand, if this frequency is more than about 1 GHz, then engineering challenges can arise which are not justified by the improvement in signal quality above such frequencies. Preferably, therefore, the frequency of clock source 212 is within the range of 100 kHz to 1 GHz, and more preferably on the order of 1 MHz.

The sw2 terminal is connected to an amplifier/integrator 214, which amplifies the voltage across the interferometer 138. The interferometer signal may be on the order of three millivolts, which is amplified to about a one volt level (Vmax). The amplified signal is applied to an RC integrator with time constant that may be near 0.1 seconds.

The amplifier/integrator 214 may for example include an operational amplifier feeding a resistor followed by a capacitor to ground, with the output of the amplifier/integrator 214 being taken from the junction between the resistor and capacitor, as illustrated in the drawing. The time constant of the integrator should be short enough that the output can follow the variation during the sweep, since a longer time constant can wash out the features. On the other hand, if the time constant is too short, there would be excessive noise.

The integrator output is applied to one input of an operational amplifier 216, the other input of which receives a reference voltage of one half of the integrator maximum generated by a reference voltage generator 218. The output of operational amplifier 216 drives current into the fb terminal 140 of the interferometer 138. In operation, this is a feedback loop which causes the interferometer switching probability to be close to 50%. In this state, the interferometer is very sensitive to changes in threshold, and such a change will cause a change in the feedback current, and therefore a change in voltage at the op-amp output. The output of operational amplifier 216, optionally after baseline subtraction and additional amplification and filtering, can be thought of as providing the Y input to the X-Y plotter or oscilloscope or data acquisition system (not shown). Interferometer 138, fb terminal 140, plus the external circuitry in FIG. 2, together with the interconnecting conductors and components, make up a "detector". Other kinds of detectors can be used in other embodiments.

In operation, the oscillator terminal osc1 is swept slowly by the frequency source (for example at the slow sweep rate mentioned above), the oscillating current output of the VCO 110 will be mostly consumed by the DUT 134, except near resonance where it will be transmitted to the control input node 136 of the interferometer 138. This node will therefore experience an increased oscillation amplitude at resonance in the current being supplied by the VCO output. If the RF in the control input node 136 increases, the feedback current injected into the node 136 from fb terminal 140 will decrease in amplitude to maintain a constant interferometer switching probability. Thus, as the frequency of the signal applied by the VCO 110 sweeps through the resonance frequency of the DUT 134, a dip will be observed, on a measuring device such as an X-Y recorder receiving the output of operational amplifier 216. In this dip, the lowest point of the voltage is the voltage corresponding to the resonance frequency, the frequency at which the amplitude of the current passing through the DUT junction is at its minimum. As previously mentioned a data acquisition system can instead be connected, which would automatically monitor the Y input and record the X value (voltage) at the time the Y value has its minimum.

It will be appreciated that this voltage can then be used, together with the critical current of the DUT 134 (assumed measured previously), to determine the junction capacitance. In particular:

$$C = \frac{I_c \Phi_0}{2\pi V_p^2}, \qquad \text{(eq. 1)}$$

where C is the junction capacitance, $I_c$ is the critical current of the DUT 134, $\Phi_0$ is the magnetic flux quantum (2.06783e$^{-15}$ Wb) (a fundamental constant), and $V_p$ is the DC voltage across the DUT 134 at the point of resonance. $V_p$ is the control voltage applied to VCO 110, as read from the osc2 terminal. The critical current $I_c$ can be determined using the test circuit 100 for example by driving a ramping (monotonically increasing) current into the dut1 terminal of the test circuit 100, and monitoring the voltage output on dut2. At the critical current level the junction will switch from the no-voltage state to the voltage state, and the DC part of the voltage output on dut2 will experience a step-voltage increase to the Josephson junction gap voltage (about 3 mV). The current that is driven into dut1 when this voltage step occurs is then the critical current $I_c$. During this critical current measurement, other terminals osc1,2, fb, sw1,2 are not connected.

The formula of (eq. 1) can be derived as follows:

A Josephson junction supports a supercurrent given by $$I = I_c \sin(\phi), \qquad \text{(eq. 2)}$$

where $I_c$ is the Junction critical current, and the phase φ is given by $$\phi = \frac{2\pi}{\Phi_0} \int_{-\infty}^{t} V(t), \qquad \text{(eq. 3)}$$

and V is the junction voltage.

Differentiating, $$\frac{dI}{dt} = I_c \cos(\phi) \frac{2\pi}{\Phi_0} V \qquad \text{(eq. 4)}$$

which has the form of an inductance, where $$L = \frac{\Phi_0}{2\pi I_c \cos(\phi)}. \qquad \text{(eq. 5)}$$

In typical measurements, no DC current is applied to the junction under test, so that its phase φ as calculated by (eq. 3) is zero, and the cosine term of (eq. 4) is unity. This inductance L will resonate with the junction capacitance, with high 'Q' if the junction is strongly hysteretic. If the resonance frequency is f, then the DC voltage Vp across a Josephson junction oscillating at that frequency is $$V_p = f\Phi_0, \qquad \text{(eq. 6)}$$

and given $$(2\pi f)^2 = \frac{1}{LC}, \qquad \text{(eq. 7)}$$

one can solve for C given L and using $V_p$ $$C = \frac{I_c \Phi_0}{2\pi V_p^2}, \qquad \text{(eq. 8)}$$

which is (eq. 1).

Since the junction critical current $I_c$ can be measured accurately, and by being able to directly measure the $V_p$, and the junction capacitance JcC can be determined with precision. As an example calculation, with an estimated value of C=0.7 pF at $I_c$=1.0 mA, one finds that $V_p$=0.686 mV.

This corresponds to a resonance frequency of 332 GHz. This value of Vp should not be far from the actual measured value obtained from the system described, assuming that the estimated capacitance value used above, obtained by some other method, is reasonably accurate. This calculation provides the approximate Vp for a typical Josephson junction fabrication process, such as the government foundry operated at MIT Lincoln Laboratory.

Table I below sets forth example component values for the on-chip test circuit 100.

| Component | Representative Value |
| --- | --- |
| Filter resistors (connect to i/o terminals) | 50 ohms |
| Filter inductors (connect to filter resistors) | 1 nH |
| R1 | 0.25 ohms |
| L1 | 10 pH |
| J1 | 0.3 mA |
| R2 | 50 ohms |
| J2 (device under measurement) | 0.3 mA |
| R3 | 50 ohms |
| J3, J4 | 0.3 mA |

-continued

| Component | Representative Value |
| --- | --- |
| Interferometer upper inductors | 15 pH |
| Interferometer lower inductors | 5 pH |
| Interferometer coupling constant | 0.57 (between upper and lower inductors) |

Table II below sets forth example component values of the external measurement system, in FIG. 2.

| Component | Representative Value |
| --- | --- |
| Rfb (feedback resistor) | 10K ohms |
| Integration Resistor | 1K ohms |
| Integration Capacitor | 10 µF |
| Vm (design voltage value) | 100 mV |
| Clock | Square wave, 100 KHz |
| Swept DC | Repeating DC ramp, 0.1 sec period |

Figure 3:
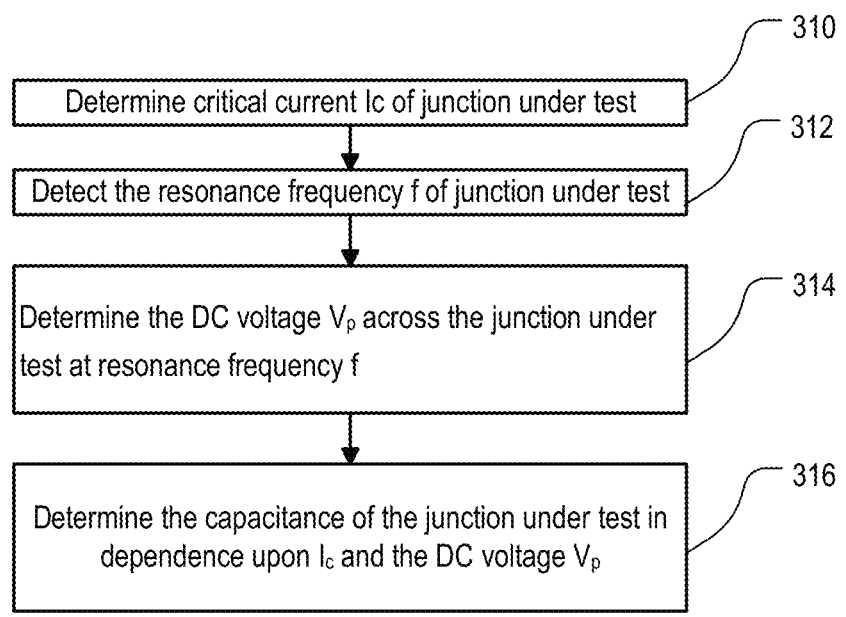
FIG. 3 is an overall flow chart illustrating a capacitance measurement method in accordance with aspects of the invention.

FIG. 3 is an overall flow chart illustrating a capacitance measurement method in accordance with aspects of the invention. Initially, in step 310, the critical current Ic of the junction under test is measured. In step 312, the resonance frequency f of the junction under test is detected. In step 314, the DC voltage Vp across the junction under test at resonance frequency f is determined, and in step 316, the capacitance of the junction under test is determined in dependence upon Ic and the DC voltage Vp. (Eq. 1) can be used for this purpose. As with all flow charts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that in a specific embodiment, numerous additional steps for accomplishing other functions for that embodiment can be performed before, after and between those steps shown.

Figure 4:
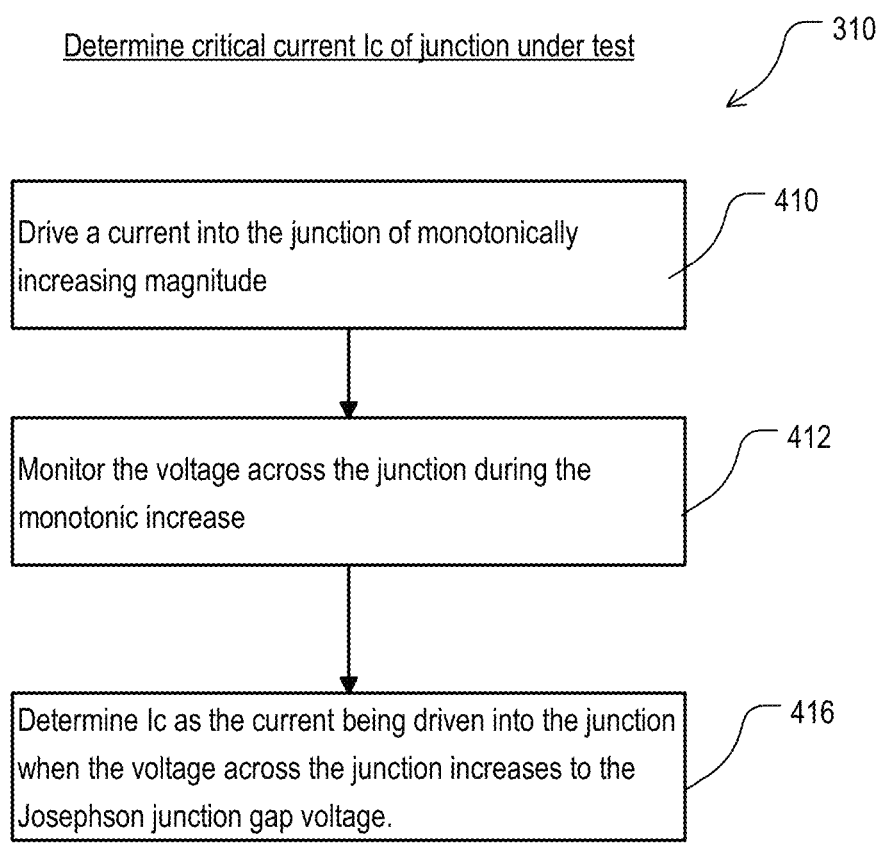
FIG. 4 is a flow chart illustrating a method to determine the critical current of a Josephson junction.

FIG. 4 is a flow chart illustrating a method to determine the critical current of a Josephson junction. This method can be used in step 310 (FIG. 3). It involves, in step 410, driving a current into the junction of monotonically increasing magnitude, and in step 412, monitoring the voltage across the junction during the monotonic increase. In step 416, Ic is determined as the current being driven into the junction when the voltage across the junction increases to the Josephson junction gap voltage.

Figure 5:
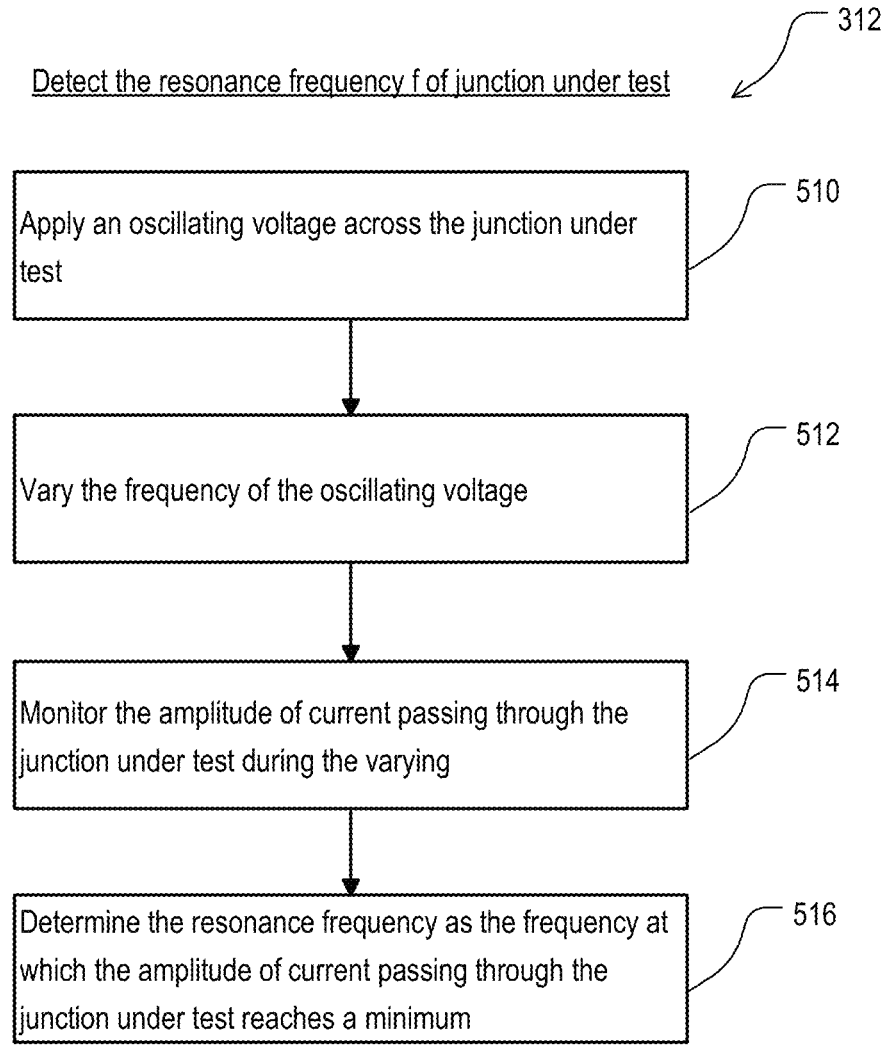
FIG. 5 is a flow chart illustrating a method for detecting the resonance frequency f of junction under test.

FIG. 5 is a flow chart illustrating a method for detecting the resonance frequency f of junction under test. This method can be used in step 312 (FIG. 3). In step 510, an oscillating voltage is applied across the junction under test. In step 512, the frequency of the oscillating voltage is varied. The amplitude of current passing through the junction under test during the varying is monitored in step 514, and in step 516 the resonance frequency is determined as the frequency at which the amplitude of current passing through the junction under test reaches a minimum.

Figure 6:
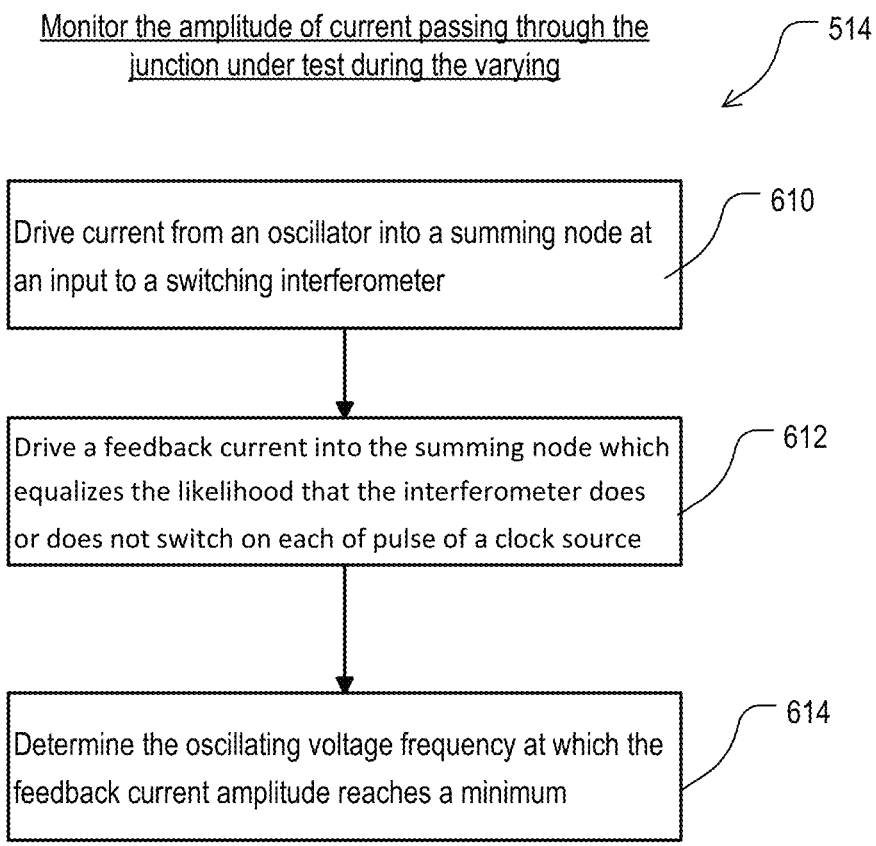
FIG. 6 is a flow chart illustrating a method for monitoring the amplitude of current passing through a junction under test while the oscillation frequency is varying.

FIG. 6 is a flow chart illustrating a method for monitoring the amplitude of current passing through a junction under test while the oscillation frequency is varying. In step 610, current from an oscillator is driven into a summing node at an input to a switching interferometer. In step 612, a feedback current is driven into the summing node which equalizes the likelihood that the interferometer does or does not switch on each of pulse of a clock source. In step 614, the oscillating voltage frequency at which the feedback current amplitude reaches a minimum is determined.

EDA System/Workflow Explanation

Figure 7:
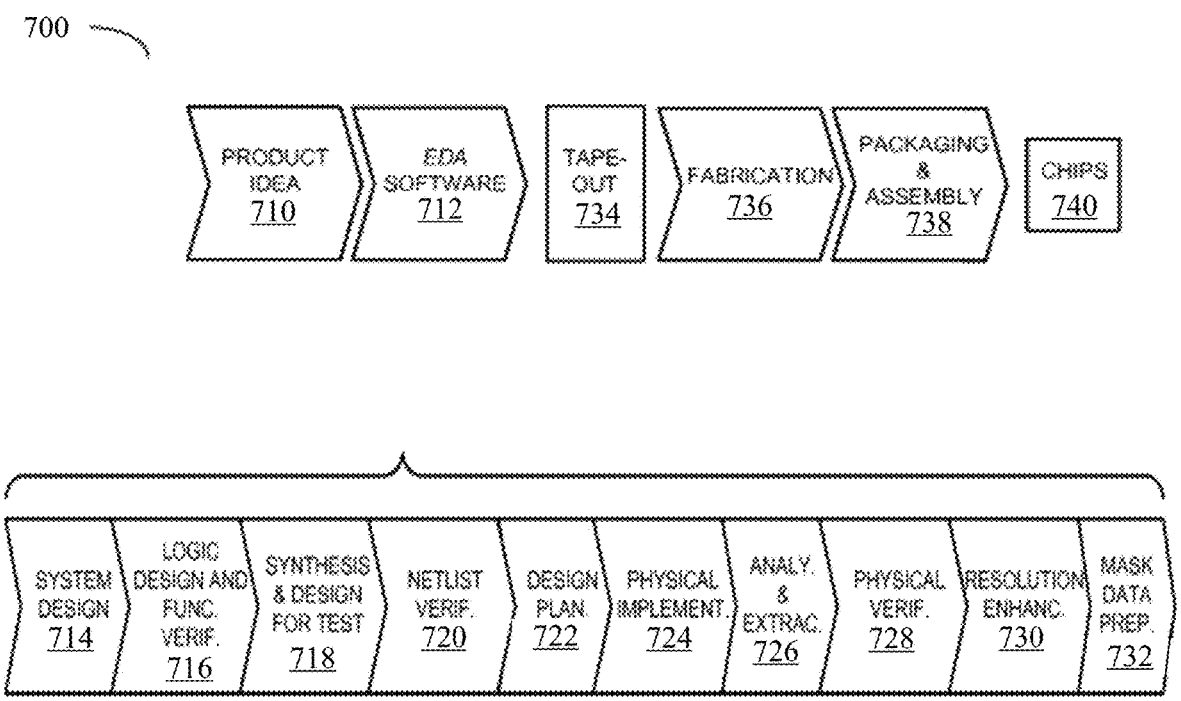
FIG. 7 depicts a flowchart of various operations in the design and fabrication of an integrated circuit in accordance with an embodiment of the present disclosure.

FIG. 7 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 710 with information supplied by a designer, information which is transformed during a process to create an item of manufacture (referred to herein as a design or device) that uses an EDA software tool 712, which may also be signified herein as EDA software, as a design tool, or a verification tool. When the design is finalized, it can be taped-out 734, which typically is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed, which result in the finished integrated circuit 740 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 712 includes processes 714-732, which are described below. This design flow description is for illustration purposes only and is not meant to limit the present disclosure. For example, an actual integrated circuit design may require a designer to perform the design operations in a different sequence than the sequence described herein.

During system design 714, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 716, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (RTM="Registered Trademark").

During synthesis and design for test 718, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 720, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 722, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 724, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 726, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 728, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 730, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 732, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 712.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

General Computer Explanation

FIGS. 8A, 8B and 8C are simplified block diagrams of a computer system suitable for use with embodiments of the technology, as well as circuit design and circuit embodiments of the technology.

In FIG. 8A, computer system 810 typically includes at least one computer or processor 814 which communicates with a number of peripheral devices via bus subsystem 812. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 824, comprising a memory subsystem 826 and a file storage subsystem 828, user interface input devices 822, user interface output devices 820, and a network interface subsystem 816. The input and output devices allow user interaction with computer system 810.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 810 depicted in FIG. 8A is intended only as one example for purposes of illustrating the preferred embodiments. Many other configurations of computer system 810 are possible having more or less components than the computer system depicted in FIG. 8A.

Network interface subsystem 816 provides an interface to outside networks, including an interface to communication network 818, and is coupled via communication network 818 to corresponding interface devices in other computer systems or machines. Communication network 818 may comprise many interconnected computer systems, machines and communication links. These communication links may be wireline links, optical links, wireless links, or any other devices for communication of information. Communication network 818 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 822 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 810 or onto communication network 818. User interface input devices typically allow a user to select objects, icons, text and the like that appear on some types of user interface output devices, for example, a display subsystem.

User interface output devices 820 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 810 to the user or to another machine or computer system.

Memory subsystem 826 typically includes a number of memories including a main random-access memory (RAM) 830 (or other volatile storage device) for storage of instructions and data during program execution and a read only memory (ROM) 832 in which fixed instructions are stored. File storage subsystem 828 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 828.

Bus subsystem 812 provides a device for letting the various components and subsystems of computer system 810 communicate with each other as intended. Although bus subsystem 812 is shown schematically as a single bus, alternative embodiments of the bus subsystem may use multiple busses. For example, RAM-based main memory can communicate directly with file storage systems using Direct Memory Access (DMA) systems.

FIG. 8B depicts a memory 840 such as a non-transitory, computer readable data and information storage medium associated with file storage subsystem 828, and/or with network interface subsystem 816, and can include a data structure specifying a circuit design. The memory 840 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 8C signifies an integrated circuit 890 created with the described technology that includes one or more cells selected, for example, from a cell library.

Emulation Environment Explanation

Figure 9:
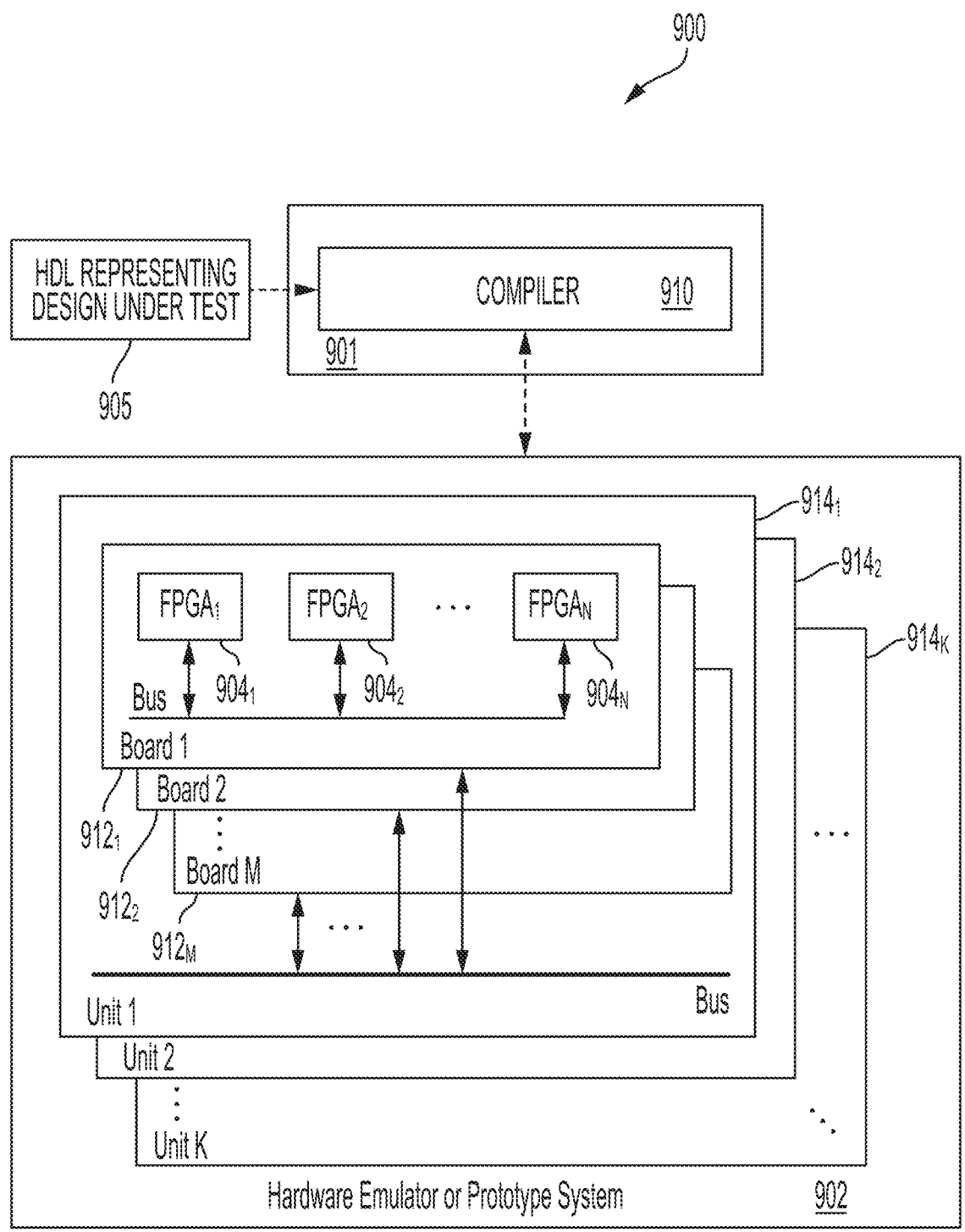
FIG. 9 depicts a block diagram of an emulation system.

An EDA software system, such as element 712 depicted in FIG. 7 typically includes an emulation system 716 to verify the functionality of the circuit design. FIG. 9 depicts a typical emulation system which includes a host computer system 901 (often part of an EDA system) and an emulator system 902 (typically a set of programmable devices such as Field Programmable Gate Arrays (FPGAs)). The host system generates data and information, typically using a compiler 910, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBus Server available from Synopsys, Inc.

The host system 901 comprises one or more processors. In the embodiment where the host system is comprised of multiple processors, the functions described herein as being performed by the host system may be distributed among the multiple processors.

The host system 901 typically includes a compiler 910 that processes code written in a hardware description language that represents a DUT, producing data (typically binary) and information that is used to configure the emulation system 902 to emulate the DUT. The compiler 910 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $904_1$ to $904_N$ in FIG. 9. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $904_1$-$904_N$ may be placed into one or more hardware boards $912_1$ through $912_M$. Many of such boards may be placed into a hardware unit, e.g. $914_1$. The boards within a unit may be connected using the backplane of the unit or any other types of connections. In addition, multiple hardware units (e.g., $914_1$ through $914_K$) may be connected to each other by cables or any other means to form a multi-unit system. In general, the hardware emulation or prototype system 902 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 901 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 910 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/reemulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilinx or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

Semantic Support

The signifier 'commercial solution' signifies, solely for the following paragraph, an engineering domain-specific (and thus non-preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract' } how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A method for measuring capacitance of a Josephson junction under test, comprising:
   detecting the resonance frequency f of the Josephson junction under test;
   determining the direct current (DC) voltage $V_p$ across the Josephson junction under test at the resonance frequency f; and
   determining the capacitance of the Josephson junction under test in dependence upon a critical current $I_c$ of the Josephson junction under test and the DC voltage $V_p$.

2. The method of claim 1, further comprising determining the critical current $I_c$ of the Josephson junction under test.

3. The method of claim 2, wherein determining the critical current $I_c$ of the Josephson junction under test comprises:
   driving a current into the Josephson junction of monotonically increasing magnitude;
   monitoring the voltage across the Josephson junction during the monotonic increase; and
   determining Ic as the current being driven into the Josephson junction when the voltage across the Josephson junction increases to the Josephson junction gap voltage.

4. The method of claim 1, wherein detecting the resonance frequency f of the Josephson junction under test comprises:
   applying an oscillating signal across the Josephson junction under test;
   varying the frequency of the oscillating signal;
   monitoring the amplitude of current passing through the Josephson junction under test during the varying; and
   determining the resonance frequency as the frequency at which the amplitude of current passing through the Josephson junction under test reaches a minimum.

5. The method of claim 4, wherein monitoring the amplitude of current passing through the Josephson junction under test during the varying comprises:
   driving current from an oscillator into a summing node at an input to a switching interferometer; and
   driving a feedback current into the summing node which equalizes the likelihood that the interferometer does or does not switch on each of pulse of a clock source,
   and wherein determining the resonance frequency comprises determining the oscillating voltage frequency at which the feedback current amplitude reaches a minimum.

6. The method of claim 1, further comprising applying a slowly varying voltage to a control input of a voltage-controlled oscillator (VCO), the VCO having an oscillating output voltage applied across the Josephson junction under test.

7. The method of claim 6, wherein the VCO is a Josephson junction which oscillates at a frequency determined by the voltage at the control input of the VCO,
   and wherein determining the DC voltage $V_p$ across the Josephson junction under test at resonance frequency f comprises measuring the voltage applied to the control input of the VCO when the resonance frequency f is detected.

8. The method of claim 1, wherein determining the capacitance of the Josephson junction under test comprises calculating the capacitance from the formula $$C = \frac{I_c \Phi_0}{2\pi V_p^2},$$

where $\Phi_0$ is the magnetic flux quantum.

9. An apparatus for measuring capacitance of a Josephson junction under test, comprising:
   a VCO having a voltage control input and further having an output connected to apply an oscillating voltage across the Josephson junction under test;
   a signal generator which applies a varying voltage to the control input of the VCO such as to vary the frequency of the oscillating voltage; and
   a resonance detector which detects when the frequency of the signal across the Josephson junction under test is such that the current passing through the Josephson junction is at a minimum,
   the voltage at the voltage control input of the VCO when resonance is detected being usable to determine the capacitance of the Josephson junction under test.

10. The apparatus of claim 9, wherein the VCO comprises a resistance connecting the voltage control input of the VCO to ground, and an inductor connecting the voltage control input of the VCO to the output of the VCO, and a Josephson junction connected from the output of the VCO to ground.

11. The apparatus of claim 9, wherein the resonance detector comprises:
   a switching interferometer having a switching signal input and further having a control input node connected through a resistance to a terminal of the Josephson junction under test; and
   a feedback terminal which injects into the interferometer control input node a current having a level which equalizes the probability that the interferometer will or will not switch in response to a signal transition on the switching signal input,
   the level of the current injected from the feedback terminal having a minimum when the frequency of the signal across the Josephson junction under test equals the resonance frequency of the Josephson junction under test.

12. The apparatus of claim 11, wherein the resonance detector further comprises:
   a clock signal generator applying signal transitions on the switching signal input;
   an amplifier/integrator having an input coupled to the switching signal input;
   an op-amp having one input connected to an output of the amplifier/integrator, a second input connected to receive a fixed reference voltage, and an output connected through resistance to the feedback terminal.

* * * * *